(12) United States Patent
New et al.

(10) Patent No.: US 7,606,108 B2
(45) Date of Patent: Oct. 20, 2009

(54) ACCESS COLLISION WITHIN A MULTIPORT MEMORY

(75) Inventors: David Anthony New, Cambridge (GB); Gus Yeung, Austin, TX (US); Martin Jay Kinkade, Austin, TX (US); David John Willingham, Ilford (GB)

(73) Assignee: ARM Limited, Cambridge (GB)

( * ) Notice: Subject to any disclaimer, the term of this patent is extended or adjusted under 35 U.S.C. 154(b) by 150 days.

(21) Appl. No.: 11/984,442

(22) Filed: Nov. 16, 2007

(65) Prior Publication Data

US 2009/0129194 A1    May 21, 2009

(51) Int. Cl.
    *G11C 8/00* (2006.01)
(52) U.S. Cl. .............. 365/230.05; 365/154; 365/233.11
(58) Field of Classification Search .................. 365/154, 365/230.05, 233.11
    See application file for complete search history.

(56) References Cited

U.S. PATENT DOCUMENTS 6,539,455 B1 *    3/2003    Khanna et al. ............... 711/108

* cited by examiner

*Primary Examiner*—Hoai V Ho
(74) *Attorney, Agent, or Firm*—Nixon & Vanderhye P.C.

(57) ABSTRACT

A multiport memory 2 is provided with control circuitry 14 which detects signal values indicative of concurrent write and read accesses via respective bit lines of a plurality of data access ports to a common row of bit cells. When such signals are detected, an override signal is generated and supplied to override circuitry 34, 36, 38, 40, 42, 44. The override circuitry is responsive to the override signal to drive one or more bit values being written to respective bit cells via their associated bit lines onto associated bit lines of other of a plurality of data access supports that are concurrently enabled for access to their bit cells. Thus, write data is also written onto the bit lines associated with a port performing a concurrent read operation.

19 Claims, 9 Drawing Sheets

ACCESS COLLISION WITHIN A MULTIPORT MEMORY

BACKGROUND OF THE INVENTION

1. Field of the Invention

This invention relates to the field of multiport memories. More particularly, this invention relates to mechanisms for reducing problems associated with collisions occurring between concurrent data accesses via different memory ports to the same portions of a memory.

2. Description of the Prior Art

It is known to provide multiport memories such that different regions (bit cells) within the memory may be accessed via one of a plurality of different memory ports. As an example, write accesses may take place to one portion of memory whilst concurrently read accesses take place to another portion of that same memory. This increases the capability of the memory to service access requests. Furthermore, the different access ports may operate asynchronously in a manner well suited to modern integrated circuit designs in which different functional units within an integrated circuit may have a requirement for high bandwidth access a common memory and yet not be operating synchronously. Whilst the use of multiport memories is in many circumstances advantageous, it does give rise to certain difficulties.

One form of collision (conflict) arises if the same region of bit cells within a memory are concurrently written to via a plurality of different memory ports. In such circumstances the different write accesses may be seeking to drive different bit values into the bit cells and the result are unpredictable. This type of collision and the problems that arise are known and accounted for in system design. A further form of collision which can arise is one in which a write is being made to a bit cell(s) via one port whilst a read access to the same row of bit cells is being made via another port. FIG. 1 of the accompanying drawings schematically illustrates a bit cell having two access ports in the context of which the problems which arise with such a situation are described further.

When a read operation occurs on port A, word line enable signal WLA is asserted and switches on transistors MNA1 and MNA2. In the case where the bit cell is storing a "0" value, bit line BLA for port A will gradually discharge and this would normally be expected to be sensed by a sense amplifier associated with port A. However, if concurrently (at least partially overlapping in time) a write access occurs via port B to the same row of bit cells, the word line WLB for port B will be asserted and transistors NMB1 and NMB2 will be switched on. If the write access is attempting to change the bit being stored within the bit cell from an "0" to an "1", then a value of "1" will be being driven in upon bit line BLB whilst a value of "0" will be being driven along bit line BLB_N. However, as well as overcoming the feedback loop provided by the cross-coupled inverters of the bit cell in order to flip the bit value, this write operation will also need to drive the bit lines BLA and BLA_N (as their precharged voltage levels may have dropped due to the read access) as the transistors MNA1 and MNA2 are switched on. The additional capacitance of these bit lines as well as any further downstream load associated with these bit lines make it harder for the write operation being driven in via port B to flip the bit value within the bit cell. Conventional design approaches are to ensure that the write drive strength and write pulse duration are sufficient that any collision arising in this way will not prevent the bit value being correctly written into the bit cell as there will be sufficient write drive strength and time for the additional difficulty associated with also having to drive the additional set or sets of bit lines and their associated downstream circuitry to be overcome. However, as fabrication process sizes are reducing this approach becomes increasingly difficult. Increasing the write pulse duration limits the speed of operation. Reductions in fabrication process size result in an increase in the likely random device-to-device maximum variation between component specifications within the memory as well as difference at the corner cases of process. These problems are more significant at low operation voltages. These variations make it more likely that there will be bit cells for which the write/read collision will cause an error.

It will be appreciated in the above that the collision between the write access and the read access may arise even if an actual read operation is not being made to the same bit cells of the row within the memory array to which the write is being made since word lines are on/off for an entire row and accordingly the "parasitic" effect of the coupling of the bit lines associated with the read port will arise even if it is a different portion of that row which is actually being selected for read by the column multiplexers.

SUMMARY OF THE INVENTION

Viewed from one aspect the present invention provides a multiport memory comprising:

at least one array of bit cells having a plurality of bit lines each coupled to a column of bit cells within said array and a plurality of row lines each coupled to a row of bit cells within said array;

a plurality of data access ports coupled to said at least one array of bit cells, each data access port having at least one associated bit line providing data access to a respective column of bits cells within said array such that a given bit cell is enabled for access via said at least one associated bit line when a row line coupled to said given bit cell supplies an access enable signal to a row of bit cells including said given bit cell;

control circuitry responsive to signal values indicative of concurrent data accesses via respective associated bit lines of a plurality of data access ports to a common row of bit cells when at least one of said data accesses is a write access via a given data access port to generate an override signal; and override circuitry responsive to said override signal to drive one or more bit values being written to respective bit cells via respective associated bit lines of said given data access port on to associated bit lines of other of said plurality of data access ports that are concurrently enabled for access to said respective bit cells.

The present technique provides control circuitry and override circuitry which identifies the above type of write/read collision (or write/write collision (same row different columns)) in respect of a row of memory cells and provides the corrective action of using override circuitry to actively drive the bit values being written onto the bit lines of the other of the data access ports that are concurrently enabled for access to the bit cells concerned. Actively driving these other bit lines in response to the override signal generated when the collision is detected makes it easier to flip a bit value within a bit cell and thus makes the memory less prone to errors arising at corner cases of PVT and subject to a lower minimum write duration.

It will be appreciated that the signals indicative of concurrent data accesses (which may be asynchronous) can take a variety of different forms. Examples of the signals which can individually or in combination give such an indication include matching row address signals, write access selecting signals and clock signals associated with the respective ports.

In some embodiments the signals indicative of concurrent data accesses comprise concurrent matching row address signals associated with said plurality of data access ports, at least one write access selecting signal associated with said plurality of data access ports and concurrent access clocking signals associated with said plurality of data access ports.

A memory using the above techniques can include write driver circuitry within a given data access port to drive one or more bit values during a write operation. The override circuitry can comprise circuitry to couple associated bit lines of said other of plurality of said access ports to the write driver circuitry in response to the override signal. One form of such circuitry may be multiplexers with the override signal being used as a selecting signal, but it will be appreciated by those in this field that the override circuitry could take forms different to a multiplexer and still achieve the same result.

The present technique can be used in multiport memories with different total numbers of ports, such as two ports, four ports etc. Some of these ports may provide read and write access while other of the ports may be limited and provide only one type of access, e.g. either write access or read access.

In one embodiment the plurality of data access ports comprise one dedicated write access port and one dedicated read access port. In another embodiment the plurality of data access ports comprise two access ports each capable of providing both write access and read access.

Whilst the present technique is applicable to and provides a way of addressing the type of collision discussed above in memories formed with any process size, the technique is particularly useful when the multiport memory is formed of components with less than a 90 nm process size.

Viewed from another aspect the present invention provides a multiport memory comprising:

at least one array of bit cell means having a plurality of bit lines each coupled to a column of bit cell means within said array and a plurality of row lines each coupled to a row of bit cells within said array;

a plurality of data access ports coupled to said at least one array of bit cell means, each data access port having at least one associated bit line providing data access to a respective column of bits cell means within said array such that a given bit cell means is enabled for access via said at least one associated bit line when a row line coupled to said given bit cell means supplies an access enable signal to a row of bit cells including said given bit cell means;

control means responsive to signal values indicative of concurrent data accesses via respective associated bit lines of a plurality of data access ports to a common row of bit cells when at least one of said data accesses is a write access via a given data access port for generating an override signal; and override means responsive to said override signal for driving one or more bit values being written to respective bit cells via respective associated bit lines of said given data access port on to associated bit lines of other of said plurality of data access ports that are concurrently enabled for access to said respective bit cells.

Viewed from a further aspect the present invention provides a method of operating a multiport memory having:

at least one array of bit cells having a plurality of bit lines each coupled to a column of bit cells within said array and a plurality of row lines each coupled to a row of bit cells within said array; and a plurality of data access ports coupled to said at least one array of bit cells, each data access port having at least one associated bit line providing data access to a respective column of bits cells within said array such that a given bit cell is enabled for access via said at least one associated bit line when a row line coupled to said given bit cell supplies an access enable signal to a row of bit cells including said given bit cell; said method comprising:

in response to signal values indicative of concurrent data accesses via respective associated bit lines of a plurality of data access ports to a common row of bit cells when at least one of said data accesses is a write access via a given data access port, generating an override signal; and in response to said override signal, driving one or more bit values being written to respective bit cells via respective associated bit lines of said given data access port on to associated bit lines of other of said plurality of data access ports that are concurrently enabled for access to said respective bit cells.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
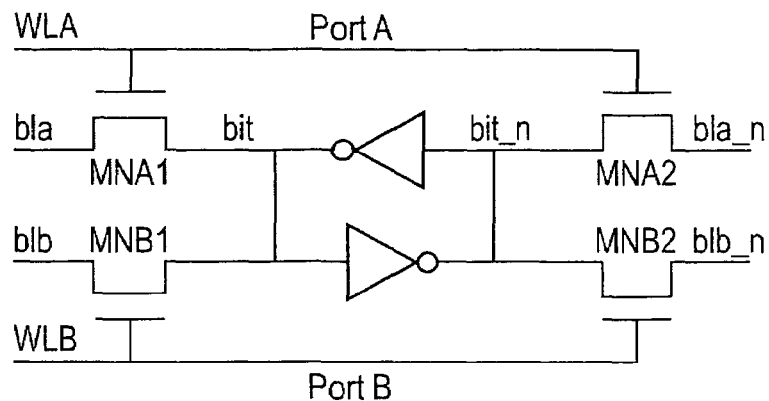
FIG. 1 schematically illustrates a bit cell within a memory array having two access ports.
Figure 2:
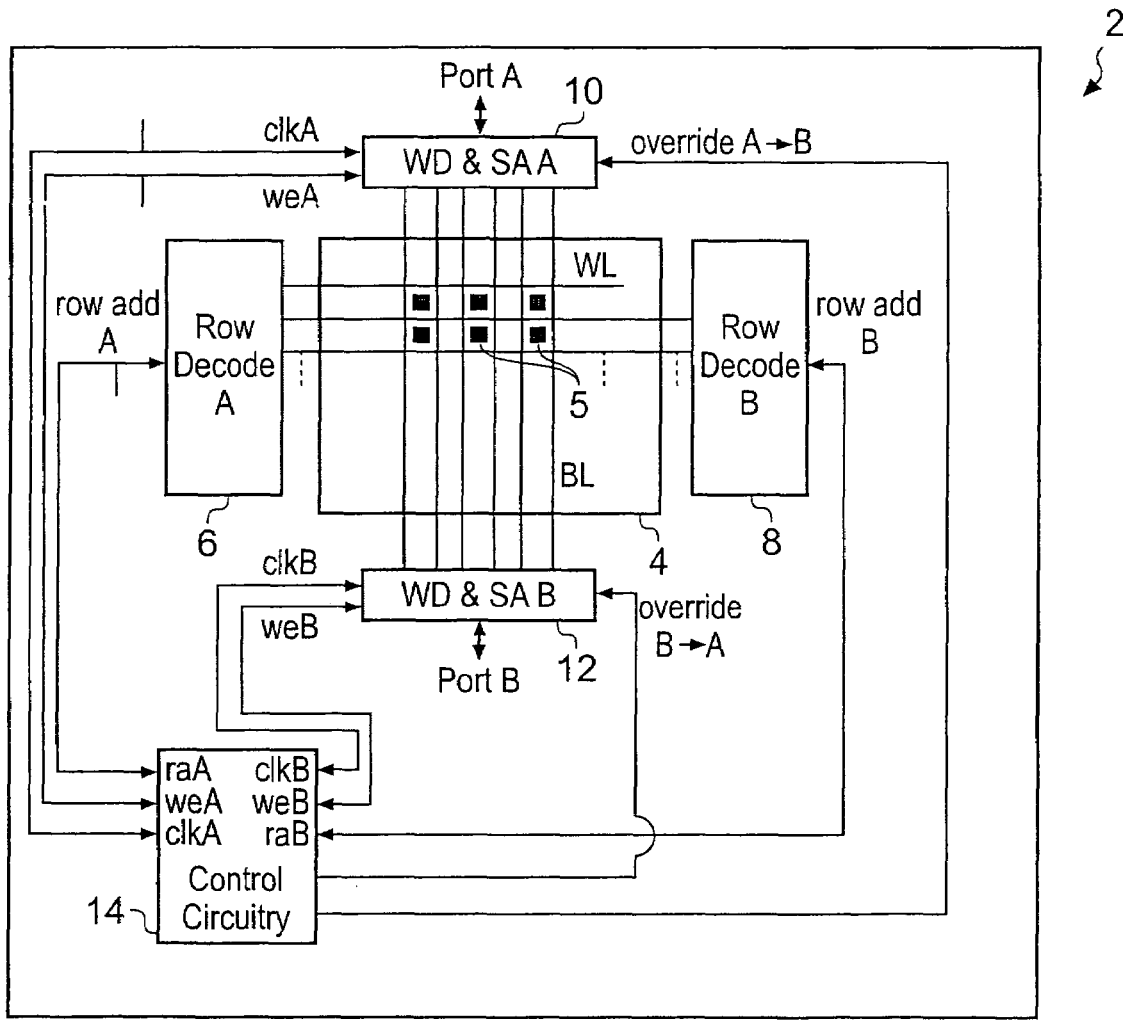
FIG. 2 schematically illustrates a multiport memory having two access ports and provided with control circuitry and override circuitry for addressing the problem of concurrent write and read operations within the same row of memory cells.

FIG. 2 shows a multiport memory 2 including an array 4 of bit cells 5 and having access ports A and B. It will be appreciated that such a multiport memory 2 may include multiple arrays 4 of bit cells, with these arrays sharing some of their control circuitry, such as timing circuitry. However, for the sake of simplicity, FIG. 2 illustrates a single array 4 of bit cells. The array 4 of bit cells is arranged in rows of bit cells and columns of bit cells as is well understood by those in this technical field. The bit cells 5 within a column of bit cells share bit lines BL through which bit values are accessed. Different rows of bit cells are selected to be coupled to these bit lines by the action of row decoders 6, 8 responsive to portions of memory address signals and serving to generate word line signals on word lines WL which enable the coupling of a row of bit cells to the bit lines of the access port concerned.

FIG. 2 shows a small number of the word lines WL and a small number of the bit lines BL discussed above. It will be appreciated that in most memories the bit lines BL are provided in pairs and it is a difference in the voltage of these bit lines which is indicative of the bit value being stored by the bit cell. However, it is also possible that individual bit lines may be used to read a bit cell. The present techniques are applicable in both of these cases.

Also illustrated in FIG. 2 are write driver WD and sense amplifier SA circuitry 10, 12 associated with respective access ports A, B. These write driver and sense amplifier circuitry blocks 10, 12 also include column multiplexers for selecting which bit lines within a row of bit lines are to be accessed in dependence upon a portion of the memory address. The override circuitry of the present technique is conveniently provided within these write driver and sense amplifier circuitry blocks 10, 12 in association with the column multiplexers as will be described later.

FIG. 2 also shows that the multiport memory 2 includes control circuitry 14 which serves to identify concurrent data accesses via respective associated bit lines of the different data access ports A and B to a common row of bit cells when at least one of these data accesses is a write access. The control circuitry generates override signals override A→B and override B→A which are respectively provided to the override circuitry within the write driver and sense amplifier circuitry blocks 10 and 12. The control circuitry 14 generates these override signals in dependence upon the row address signals, the write enable signals and the clock enable signals for the respective ports, namely raA, weA, clkA, raB, weB and clkB.

The multiport memory 2 in FIG. 2 has two memory access ports A and B, but it will be appreciated that more than two memory access ports could be provided and the present technique is applicable in such circumstances. Furthermore, each of the memory access ports can be formed to provide access via only one of reads or writes or may be formed to provide both read and write access. The present technique is applicable in both of these circumstances and when combinations of these different types of access ports are provided.

Figure 3:
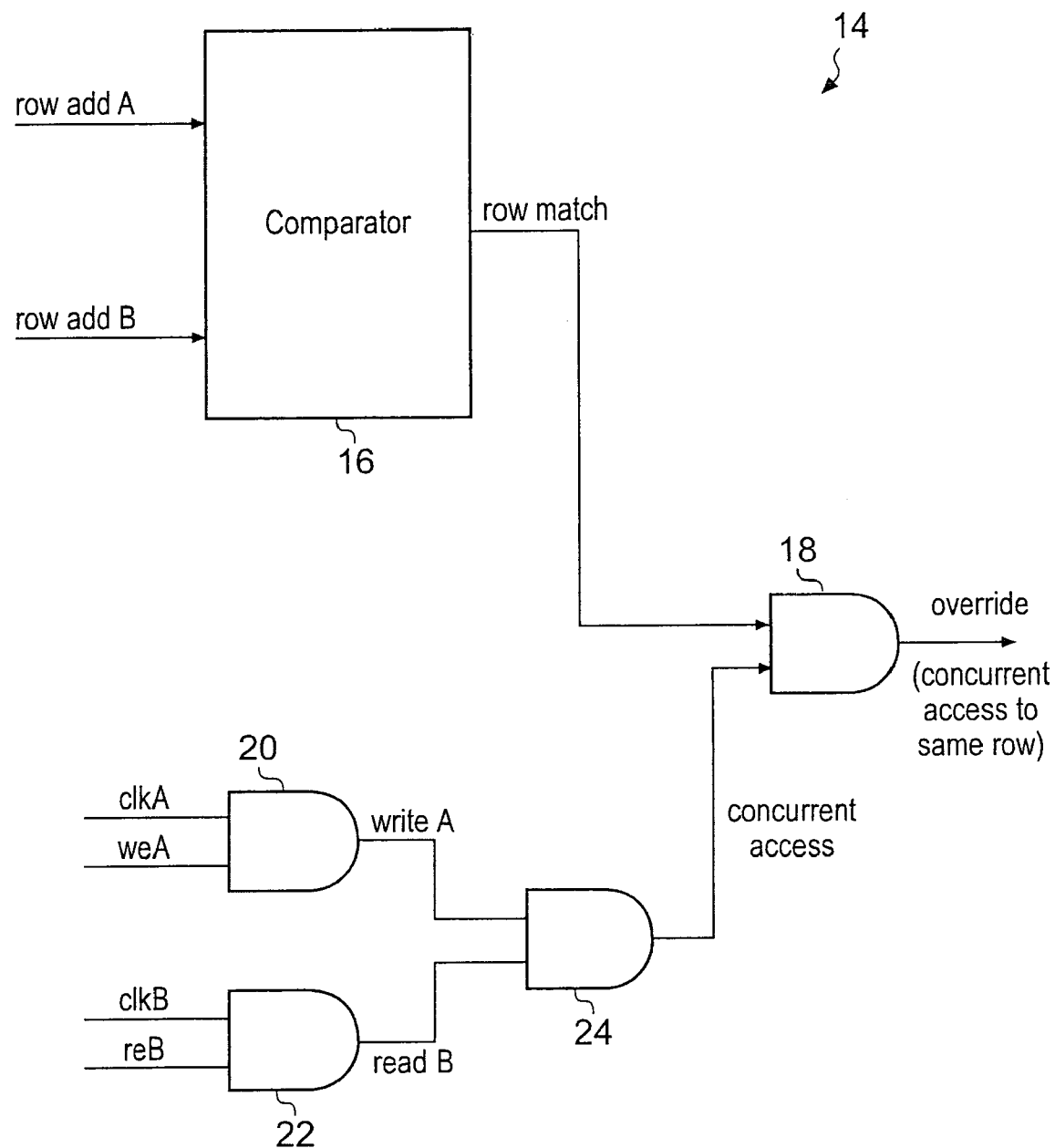
FIG. 3 illustrates a first example embodiment of control circuitry for generating an override signal.

FIG. 3 schematically illustrates the control circuitry 14 in an embodiment in which access port A is a dedicated write access port and access port B is a dedicated read access port. The control circuitry 14 in this example includes a comparator 16 which compares the portions of the memory address which correspond to the row address for selecting which row is to be accessed so as to generate a row match signal when the same row of memory cells is being accessed via port A and port B. This row match signal forms one input to an AND gate 18. Also provided is an AND gate 20 which is responsive to the clock enable signal clkA and the write enable signal weA associated with port A and which generates a signal writeA when a write operation is occurring via port A. In a similar way, an AND gate 22 associated with port B is responsive to the read enable signal reB and the clock enable signal clkB associated with the read port B to generate a read signal readB when a read operation is actually occurring via port B. The write signal writeA and the read signal readB are combined via a further AND gate 24 to generate a signal indicative of concurrent accesses, e.g. overlapping although not necessarily synchronous. The concurrent access signal is supplied as an input to the AND gate 18 such that when both a row match and a concurrent access are detected, the AND gate 18 generates an override signal which is supplied to the override circuitry.

Figure 4:
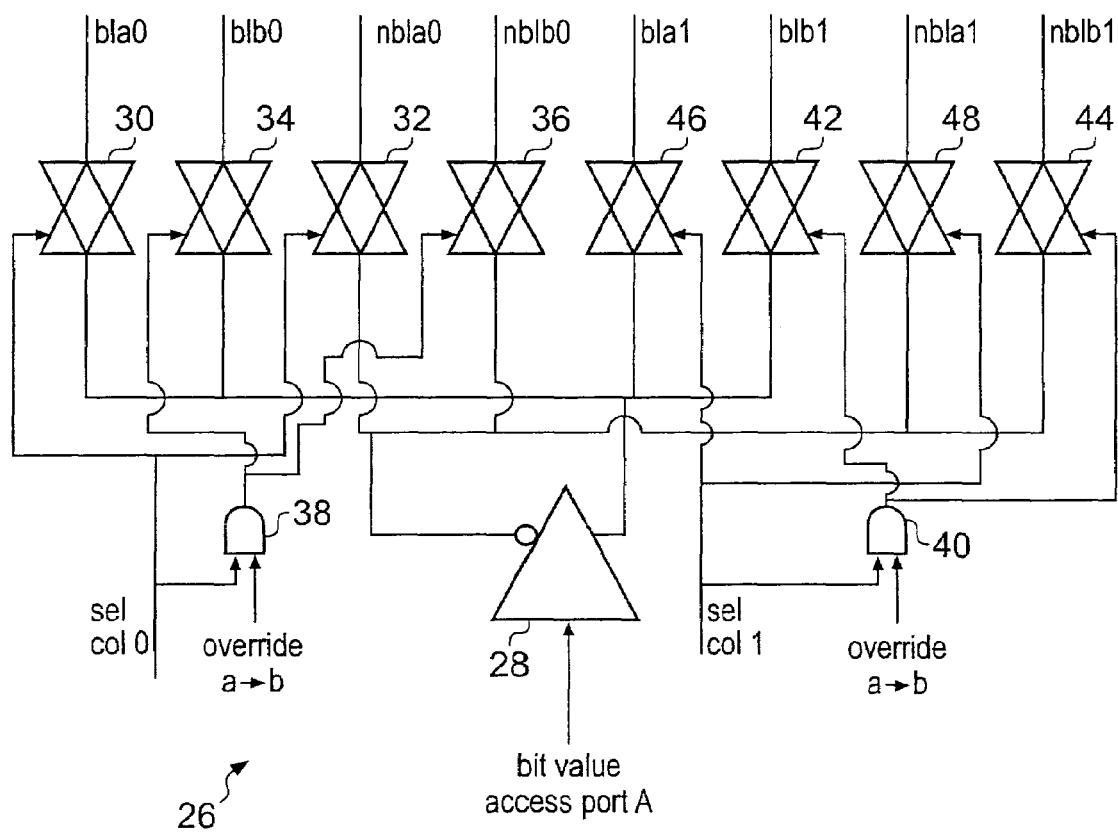
FIG. 4 schematically illustrates an example embodiment of override circuitry for driving bit values being written in a write access onto the bit lines associated with a read access (whether or not active to the same bit cells) within the same row of memory.

FIG. 4 illustrates write driver and multiplexing circuitry 26 which also includes override circuitry. In this example the memory has two ports, namely port A and port B and two-way column multiplexing is employed such that either a set of bit lines associated with columns 0 or a set of bit lines associated with columns 1 are selected for access via the column select signals illustrated. A write driver 28 is responsive to a bit value being written via port A. If column 0 is selected and no collision is detected, the transmission gates 30 and 32 will be switched on and the bit value generated by the write driver 28 driven onto the bit lines for port A column 0, namely bla0 and nbla0. If a collision is detected by the circuitry of FIG. 3 indicating that a read is occurring within the same row of bit cells at the same time as the above write operation is being performed, then the bit values being driven in via the write driver 28 for port A are also driven onto the bit lines for port B of the selected column (the column containing the bit cells in which it is desired to write bit values), i.e. bit lines blb0 and nblb0 are driven via transmission gates 34 and 36. The switching on of transmission gates 34 and 36 when a collision is detected is achieved via the AND gate 38 which combines the column select signal with the override signal.

When the column select signal for column 1 is active, the same form of operation is performed in respect of the bit lines of column 1, namely bla1, mbla1, blb1 and nblb1. The override signal is combined with the column select signal by AND gate 40 and switches on transmission gates 42 and 44 when necessary to drive the write bit value onto the bit lines normally associated with port B at the same time that the transmission gates 46 and 48 are switched on for this write to column 1 via port A.

In this example embodiment it will be appreciated that the transmission gates 34, 36, 42 and 44 together with the AND gates 38 and 40 can be considered to form the override circuitry which drives the bit values being written in accordance with the access via port A to also be driven onto the bit lines associated with port B. Other forms of such override circuitry are possible and the present technique is not limited to the form of this override circuitry illustrated in FIG. 2.

Figure 5A:
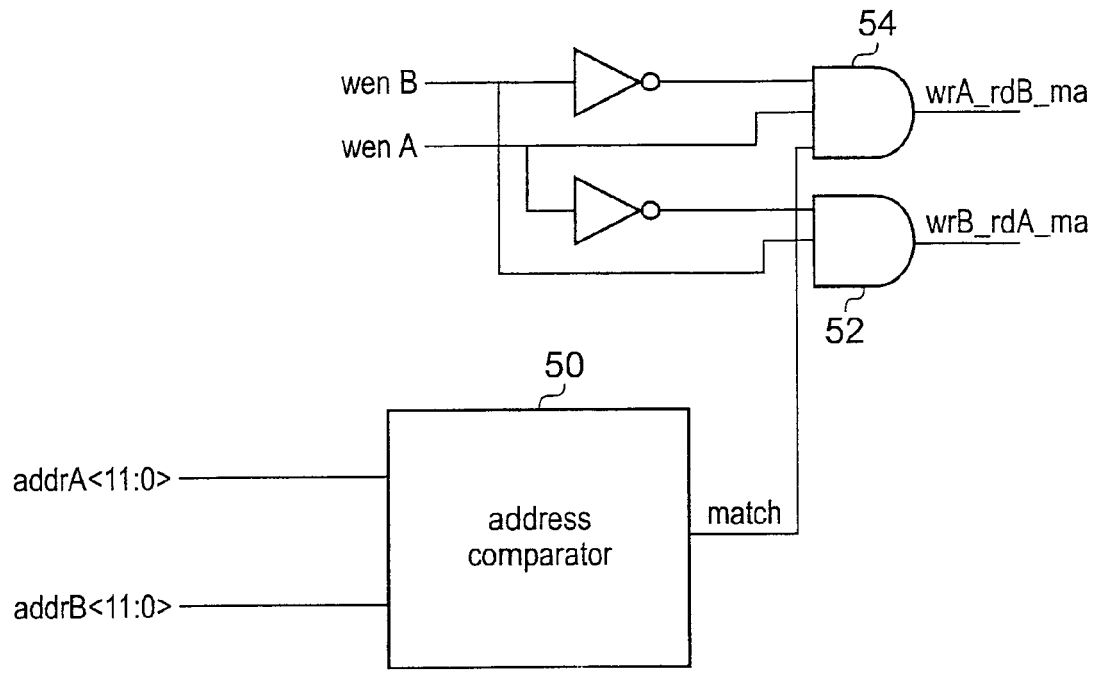
FIGS. 5A and 6A illustrate a second example embodiment of control circuitry for generating an override signal.
Figure 6A:
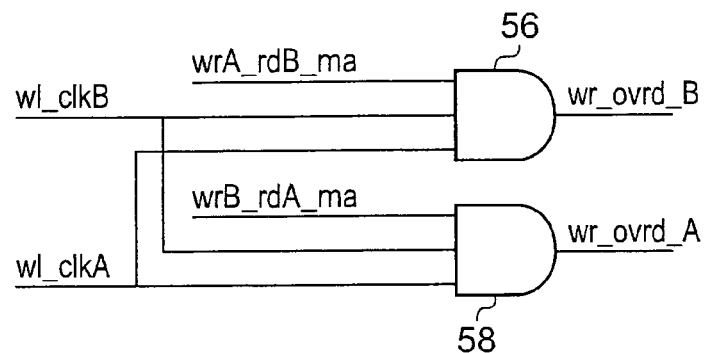

FIGS. 5A and 6A illustrate a second example embodiment of control circuitry for generating override signals indicative of concurrent write and read accesses to the same row of memory cells. In FIG. 5 an address comparator 50 compares row addresses for the respective access ports. A match signal is asserted when these addresses match and is supplied to the AND gates 52 and 54. The AND gates 52 and 54 are also supplied with the write enable signals and the inverse of the write enable signals for the respective ports A and B. Thus, AND gate 52 is supplied with the match signal, the write enable signal wenB for port B and the inverse of the write enable signal wenA for port A. Accordingly, AND gate 52 asserts a true output on signal line wrB_rdA_ma when a write is occurring via port B, a read is occurring via port A and the row address signals match. AND gate 54 generates a similar signal wrA_rdB_ma in the circumstance where the roles of port A and port B are reversed, namely when a write is occurring via port A, a read is occurring via port B and the row addresses match.

FIG. 6A illustrates further processing of the signals output from the AND gates 52 and 54 of FIG. 5. The signals from the AND gates 52 and 54 are supplied as one input to respective AND gates 56 and 58. These AND gates 56 and 58 are also supplied with both of the clock signals wl_clkA and wl_clkB for the ports A and B. Thus, the AND gates 56 and 58 through the action of the clock signals supplied to them serve to detect when concurrent (at least partially overlapping in time) accesses are being made with the correct combination of a read and a write to the same address as determined by the circuitry of FIG. 5. The outputs of the AND gates 56 and 58 are respective override signals which cause either the bit values being written by port A to be copied onto the bit lines of port B or the signals being written via port B to be copied onto the bit lines of port A.

Figure 5B:
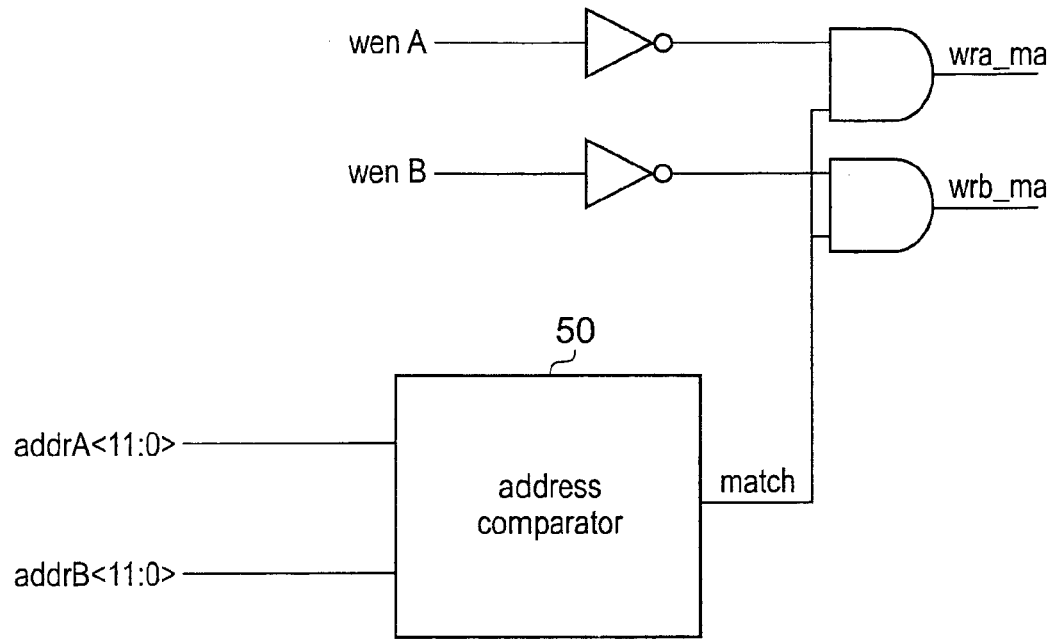
FIGS. 5B and 6B illustrate a further example embodiment of control circuitry for generating an override signal.
Figure 6B:
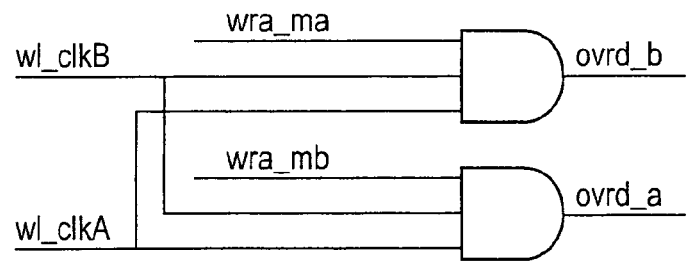

FIGS. 5B and 6B are similar to those of FIGS. 5A and 6A, but modified to respond to either write/read collisions or write/write collisions, i.e. concurrent writes to different columns within the same row. The override signals generated as the outputs in FIG. 6B serve to trigger bit values being written via one port also being written to the corresponding column bit lines for the other port.

Figure 7A:
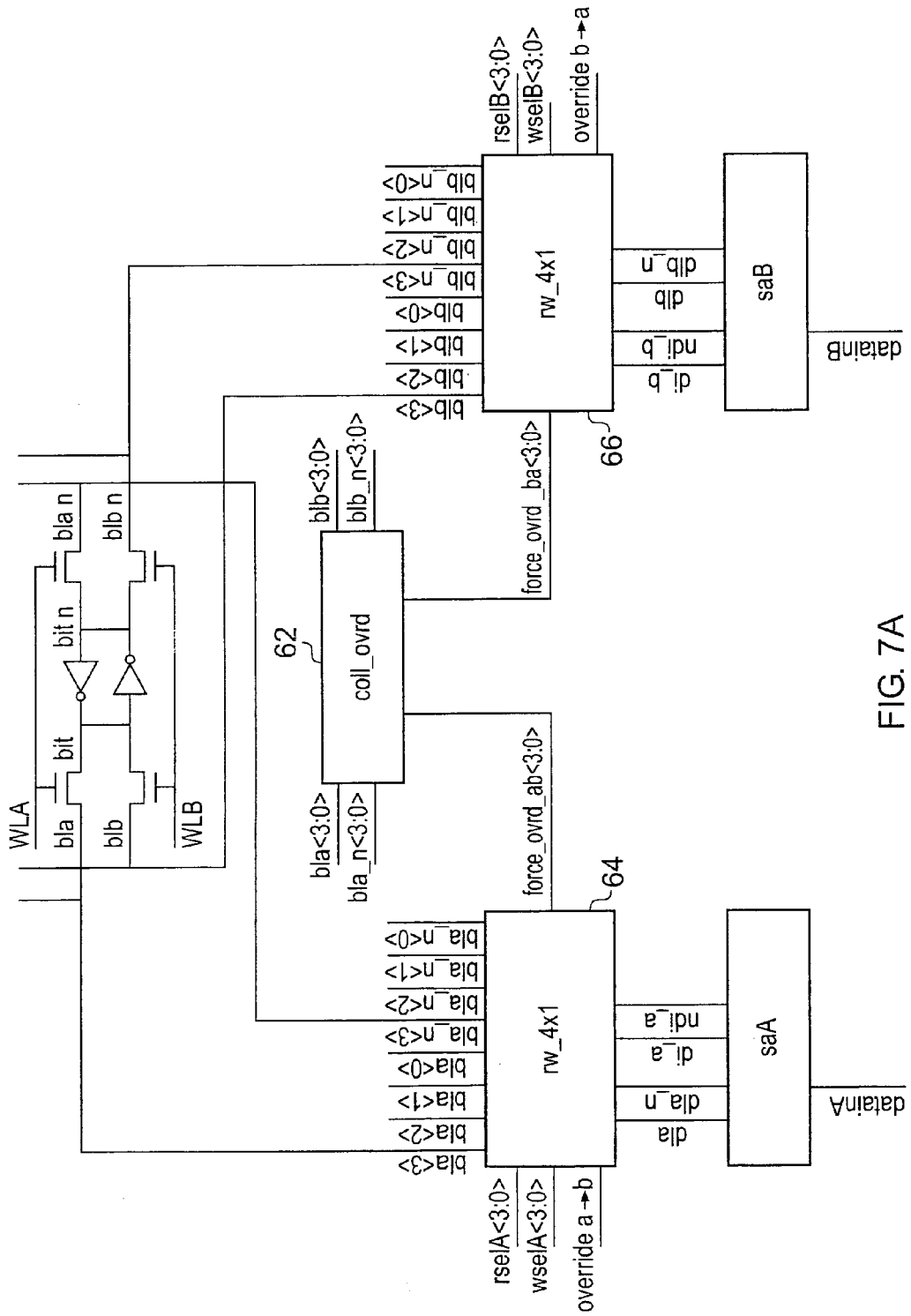
FIG. 7A schematically illustrates a memory in which two access ports are provided and each of these access ports can be used to perform either a write operation or a read operation.

FIG. 7A shows in another example embodiment how the override signals wr_ovrd_A and wr_ovrd_B may be used by override circuitry 62 associated with the ports A and B to drive bit lines of the other port when a collision occurs via action of transmission gates (multiplexing circuitry) of a type similar to that illustrated in FIG. 4. It will be appreciated that, as illustrated in FIG. 7A, the circuitry 64 and 66 which is performing the column multiplexing is additionally coupled to the bit lines of both ports in a way which would not normally occur in order to provide the ability to drive write values onto the bit lines of both ports when a collision is detected.

Figure 7B:
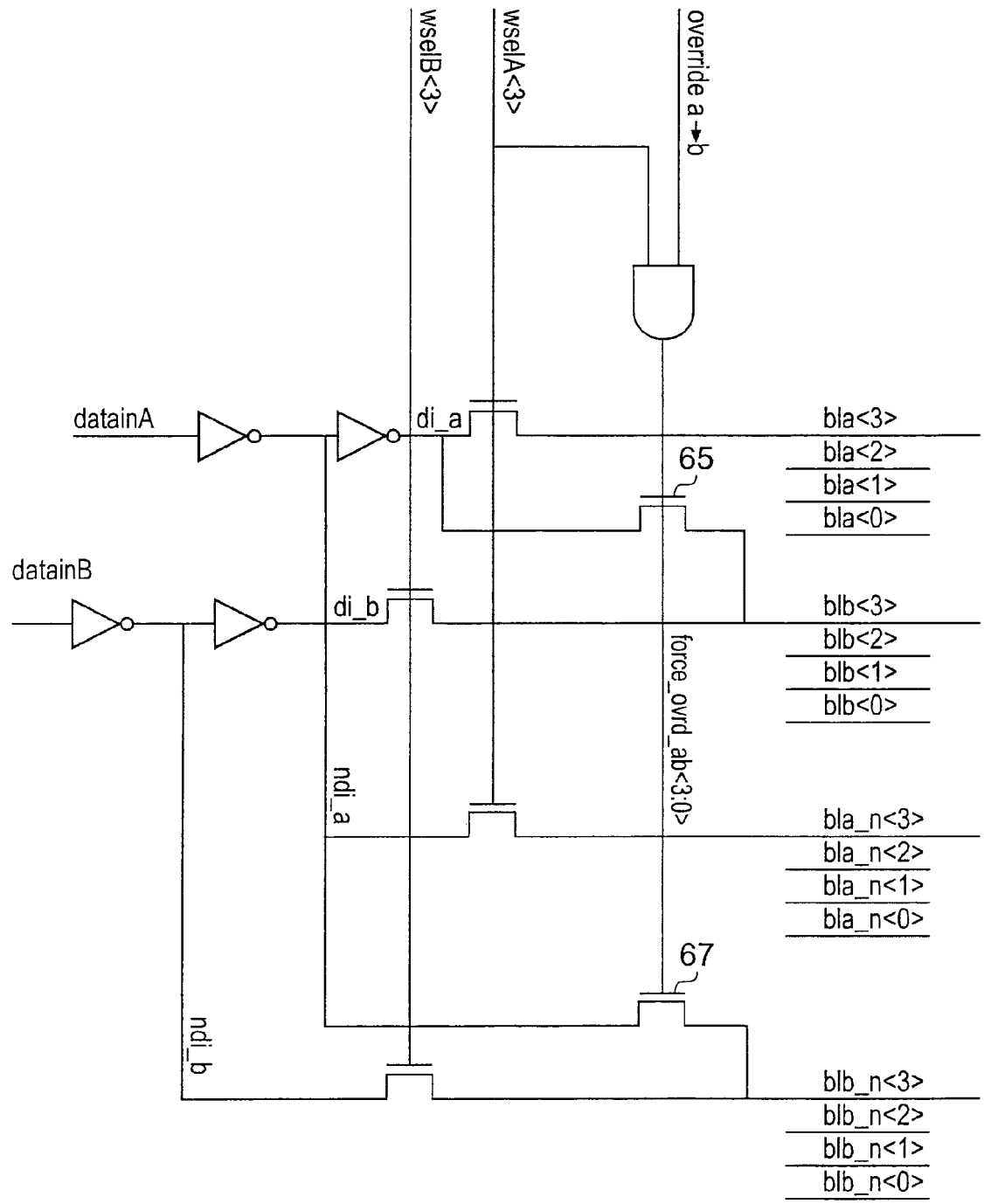
FIG. 7B schematically illustrates an example embodiment of overriding circuitry suitable for the memory of FIG. 7A.

FIG. 7B illustrates how an override signal "override a->b" can be used to switch on gates 65 and 67 to drive the data value being written on port A "data in A" on to the bit line for the same columns for port B, namely blb<3> and blb_n<3>.

Figure 8:
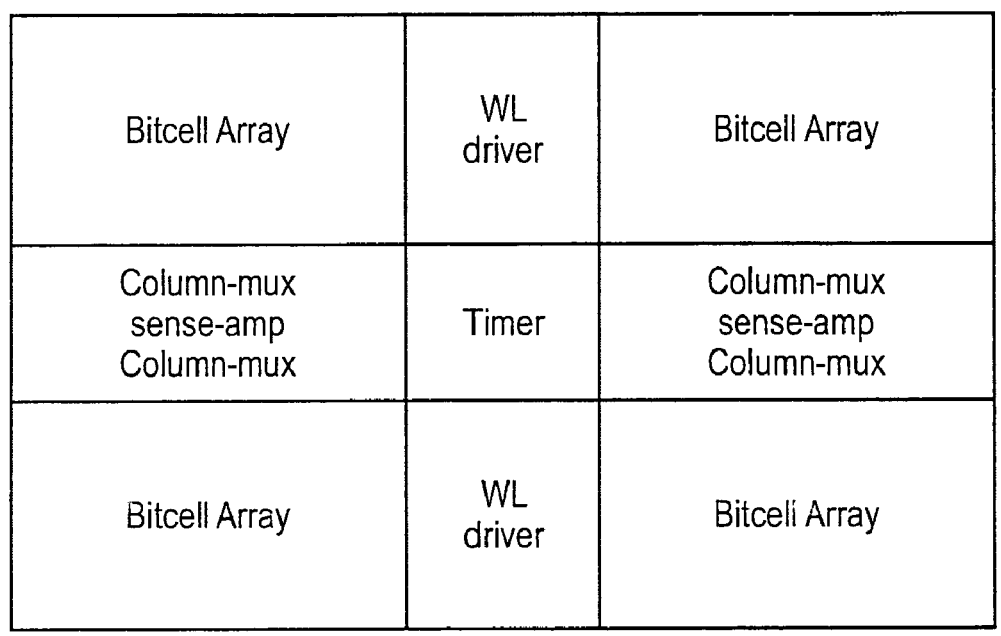
FIG. 8 schematically illustrates the high level layout of a multiport memory circuit including multiple bit cell arrays.

FIG. 8 is a high level diagram illustrating how a multiport memory 68 may be formed with multiple bit cell arrays with these sharing timer circuitry, word line driver circuitry, column multiplexing and sense amplifier circuitry where possible and where convenient for the layout. The control circuitry for detecting collisions may be provided with in the area normally associated with the timer circuitry and the override circuitry may be conveniently provided within the areas associated with the column multiplexers and sense amplifiers.

Figure 9:
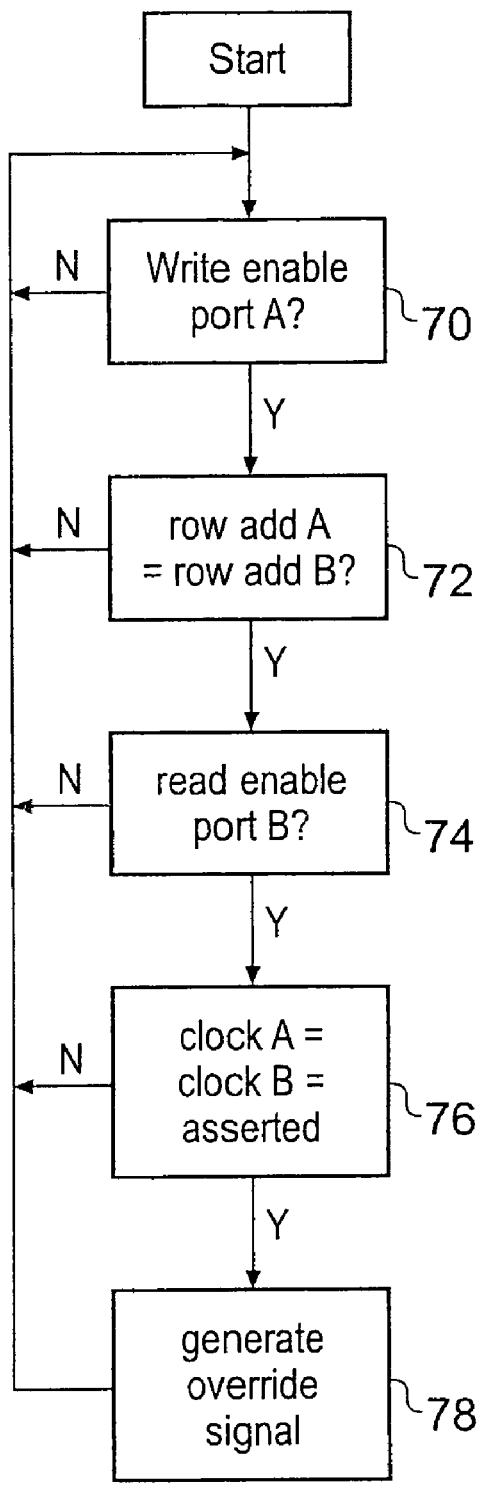
FIG. 9 is a flow diagram schematically illustrating the steps performed in identifying a collision between a write operation and a read operation to the same row of bit cells.

FIG. 9 is a flow diagram schematically illustrating the process steps performed when generating an override signal when port A is write-only and port B is read-only. At step 70 the processing waits until a write is detected as occurring on port A. When a write is detected, processing proceeds to step 72 at which the row address is for port A and for port B as currently asserted are compared. If these do not match, then processing returns to step 70. If the row addresses do match, then processing proceeds to step 74. Step 74 determines whether or not a read is currently being performed via port B. If a read operation is not being currently performed, then processing again returns to step 70. If a read is being performed via port B, then processing proceeds to step 76. Step 76 detects the simultaneous assertion of the clock enables for port A and port B such that the write operation on port A and the read operation on port B are concurrently occurring. If this is not detected, then processing returns to step 70. If the simultaneous assertion of the clocks is detected at step 76, then step 78 generates the override signal to force the bit values being written via port A to also be driven onto the bit lines for port B.

It will be appreciated by those in this technical field that the processing steps of FIG. 9 are illustrated as a serial sequence of steps whereas in practice hardware implementing these processing steps can perform these comparisons in parallel.

FIG. 9 is useful in understanding an example of the combination of circumstances which are detected to generate the override signal, i.e. the combination of signal values which are indicative of the concurrent data accesses via the respective ports.

It will further be appreciated that when write/write collisions to the same row are being detected then the flow diagram of FIG. 9 will be modified with step 74 checking for a read or write on port B. The override signal generated will trigger the bit line signals being written to the addressed columns of one port to be driven on to the corresponding bit lines of the other port.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A multiport memory comprising:
    at least one array of bit cells having a plurality of bit lines each coupled to a column of bit cells within said array and a plurality of row lines each coupled to a row of bit cells within said array;
    a plurality of data access ports coupled to said at least one array of bit cells, each data access port having at least one associated bit line providing data access to a respective column of bits cells within said array such that a given bit cell is enabled for access via said at least one associated bit line when a row line coupled to said given bit cell supplies an access enable signal to a row of bit cells including said given bit cell;
    control circuitry responsive to signal values indicative of concurrent data accesses via respective associated bit lines of a plurality of data access ports to a common row of bit cells when at least one of said data accesses is a write access via a given data access port to generate an override signal; and
    override circuitry responsive to said override signal to drive one or more bit values being written to respective bit cells via respective associated bit lines of said given data access port on to associated bit lines of other of said plurality of data access ports that are concurrently enabled for access to said respective bit cells.

2. A multiport memory as claimed in claim 1, wherein said signals indicative of concurrent data accesses include matching row address signals associated with said plurality of data access ports.

3. A multiport memory as claimed in claim 1, wherein said signals indicative of concurrent data accesses include write access selecting signals associated with said plurality of data access ports.

4. A multiport memory as claimed in claim 1, wherein said signals indicative of concurrent data accesses include access clocking signals associated with said plurality of data access ports.

5. A multiport memory as claimed in claim 1, wherein said signals indicative of concurrent data accesses comprise concurrent matching row address signals associated with said plurality of data access ports, at least one write access selecting signal associated with said plurality of data access ports and concurrent access clocking signals associated with said plurality of data access ports.

6. A multiport memory as claimed in claim 1, comprising write driver circuitry within said given data access port to drive said one or more bit values and said override circuitry comprises circuitry to couple associated bit lines of said other of said plurality of access ports to said write driver circuitry in response to said override signal.

7. A multiport memory as claimed in claim 1, wherein said plurality of data access ports comprises one dedicated write access port and one dedicated read access port.

8. A multiport memory as claimed in claim 1, wherein said plurality of data access ports comprises two access ports each capable of providing both write access and read access.

9. A multiport memory as claimed in claim 1, wherein said multiport memory is formed of components with less than a 90 nm process size.

10. A multiport memory comprising:
at least one array of bit cell means having a plurality of bit lines each coupled to a column of bit cell means within said array and a plurality of row lines each coupled to a row of bit cells within said array;
a plurality of data access ports coupled to said at least one array of bit cell means, each data access port having at least one associated bit line providing data access to a respective column of bits cell means within said array such that a given bit cell means is enabled for access via said at least one associated bit line when a row line coupled to said given bit cell means supplies an access enable signal to a row of bit cells including said given bit cell means;
control means responsive to signal values indicative of concurrent data accesses via respective associated bit lines of a plurality of data access ports to a common row of bit cells when at least one of said data accesses is a write access via a given data access port for generating an override signal; and
override means responsive to said override signal for driving one or more bit values being written to respective bit cells via respective associated bit lines of said given data access port on to associated bit lines of other of said plurality of data access ports that are concurrently enabled for access to said respective bit cells.

11. A method of operating a multiport memory having:
at least one array of bit cells having a plurality of bit lines each coupled to a column of bit cells within said array and a plurality of row lines each coupled to a row of bit cells within said array; and
a plurality of data access ports coupled to said at least one array of bit cells, each data access port having at least one associated bit line providing data access to a respective column of bits cells within said array such that a given bit cell is enabled for access via said at least one associated bit line when a row line coupled to said given bit cell supplies an access enable signal to a row of bit cells including said given bit cell; said method comprising:
in response to signal values indicative of concurrent data accesses via respective associated bit lines of a plurality of data access ports to a common row of bit cells when at least one of said data accesses is a write access via a given data access port, generating an override signal; and
in response to said override signal, driving one or more bit values being written to respective bit cells via respective associated bit lines of said given data access port on to associated bit lines of other of said plurality of data access ports that are concurrently enabled for access to said respective bit cells.

12. A method as claimed in claim 11, wherein said signals indicative of concurrent data accesses include matching row address signals associated with said plurality of data access ports.

13. A method as claimed in claim 11, wherein said signals indicative of concurrent data accesses include write access selecting signals associated with said plurality of data access ports.

14. A method as claimed in claim 11, wherein said signals indicative of concurrent data accesses include access clocking signals associated with said plurality of data access ports.

15. A multiport memory as claimed in claim 11, wherein said signals indicative of concurrent data accesses comprise concurrent matching row address signals associated with said plurality of data access ports, at least one write access selecting signal associated with said plurality of data access ports and concurrent access clocking signals associated with said plurality of data access ports.

16. A method as claimed in claim 11, comprising, in response to said override signal, coupling associated bit lines of said other of said plurality of access ports to write driver circuitry within said given data access port driving said one or more bit values.

17. A method as claimed in claim 11, wherein said plurality of data access ports comprises one dedicated write access port and one dedicated read access port.

18. A method as claimed in claim 11, wherein said plurality of data access ports comprises two access ports each capable of providing both write access and read access.

19. A method as claimed in claim 11, wherein said multiport memory is formed of components with less than a 90 nm process size.

* * * * *